United States Patent
Breedlove et al.

(10) Patent No.: US 10,147,772 B2
(45) Date of Patent: Dec. 4, 2018

(54) FOLDABLE OLED DEVICE WITH COMPATIBLE FLEXURAL STIFFNESS OF LAYERS

(71) Applicant: 3M INNOVATIVE PROPERTIES COMPANY, St. Paul, MN (US)

(72) Inventors: Evan L. Breedlove, Woodbury, MN (US); Catherine A. Leatherdale, Woodbury, MN (US); Lyudmila A. Pekurovsky, Bloomington, MN (US); Peihui Zhang, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/244,146

(22) Filed: Aug. 23, 2016

(65) Prior Publication Data
US 2018/0061893 A1 Mar. 1, 2018

(51) Int. Cl.
*H01L 27/32* (2006.01)
*G06F 3/041* (2006.01)
*H01L 29/78* (2006.01)

(52) U.S. Cl.
CPC ............ *H01L 27/322* (2013.01); *G06F 3/041* (2013.01); *G06F 3/0412* (2013.01); *H01L 29/7842* (2013.01); *G06F 2203/04102* (2013.01)

(58) Field of Classification Search
None
See application file for complete search history.

(56) References Cited

U.S. PATENT DOCUMENTS

| | | | |
|---|---|---|---|
| 5,953,087 A * | 9/1999 | Hoyt | G02F 1/133308 349/153 |
| 6,218,017 B1 * | 4/2001 | Yamashita | B32B 9/00 428/424.2 |
| 8,237,165 B2 | 8/2012 | Kim et al. | |
| 9,054,340 B2 | 6/2015 | Kim | |
| 9,645,613 B2 * | 5/2017 | Nam | G06F 1/1652 |
| 9,748,315 B2 | 8/2017 | Kim | |

(Continued)

FOREIGN PATENT DOCUMENTS

| | | | | |
|---|---|---|---|---|
| KR | 10-2011-0106539 | * | 9/2011 | ............ G02F 1/167 |
| KR | 20150080910 | | 7/2015 | |
| KR | 20160078314 | | 7/2016 | |

OTHER PUBLICATIONS

Machine translation, Kim, Korean Pat. Pub. No. KR 10-2016-0078314, translation date: Jul. 25, 2017; KIPO, all pages.*

(Continued)

*Primary Examiner* — Victoria K Hall

(57) ABSTRACT

A flexible OLED display device that includes an upper module having a cover window film, a lower module, and a display module between the upper and lower modules. The display module includes an OLED and an OLED substrate. The stiffnesses of components in the display device are controlled to satisfy a particular relationship such that the bending stiffnesses of the upper and lower modules are tuned in order to position the neutral bending plane below the display module, which places the display into a state of compressive strain as opposed to zero strain. This design is suitable for a bifold flexible display in which the upper module can be folded to face itself.

26 Claims, 5 Drawing Sheets

(56) References Cited

U.S. PATENT DOCUMENTS

| | | | |
|---|---|---|---|
| 2010/0041205 A1* | 2/2010 | Lamrani | H01L 21/823807 438/424 |
| 2013/0041235 A1* | 2/2013 | Rogers | A61B 5/6867 600/306 |
| 2013/0278556 A1* | 10/2013 | Conway | G06F 3/0412 345/174 |
| 2014/0367644 A1* | 12/2014 | Song | H01L 51/0097 257/40 |
| 2015/0102298 A1 | 4/2015 | Namkung et al. | |
| 2015/0147532 A1* | 5/2015 | Nam | G02B 26/005 428/172 |
| 2015/0179722 A1 | 6/2015 | Koo et al. | |
| 2015/0185782 A1* | 7/2015 | Kim | G06F 1/1652 349/12 |
| 2015/0194618 A1 | 7/2015 | Cheng et al. | |
| 2015/0200375 A1 | 7/2015 | Kim et al. | |
| 2015/0266272 A1* | 9/2015 | Lee | B32B 17/064 428/189 |
| 2017/0064845 A1* | 3/2017 | Jung | H05K 1/028 |
| 2017/0153668 A1* | 6/2017 | Jang | G06F 1/1641 |
| 2018/0004254 A1* | 1/2018 | Park | G06F 1/1626 |

OTHER PUBLICATIONS

Machine translation, Kim, Korean Pat. Pub. No. KR 10-2015-0080910, translation date: Jul. 25, 2017, KIPO, all pages.*

Machine translation, Yu, Korean Pat. Pub. No. KR 10-2011-0106539, translation date: Dec. 22, 2017, KIPO, all pages.*

Machine translation, Yu, Korean Pat. Pub. No. KR 10-2011-0106539, translation date: Dec. 22, 2017, Espacenet, all pages.*

Translation, Ryu, Korean Pat. Pub. No. KR 10-2011-0106539, translation date: Feb. 2018, Phoenix Translations, all pages.*

H. Cheng et al, Bending Characteristics of Foldable Touch Display Panel with a Protection Structure Design, Mar. 2015, Advances in Material Science and Engineering, vol. 2015, Article ID 106424, all pages.*

KIPO, Written Opinion of the International Search Authority, PCT App. No. PCT/IB2017/054946, dated Mar. 1, 2018, WIPO, all pages.*

PCT International Search Report for PCT/IB2017/054946, dated Nov. 30, 2017.

* cited by examiner

FOLDABLE OLED DEVICE WITH COMPATIBLE FLEXURAL STIFFNESS OF LAYERS

BACKGROUND

Displays and electronic devices have evolved to be curved, bent, or folded and provide new user experiences. These device architectures may include flexible organic light emitting diodes (OLEDs), plastic liquid crystal displays (LCDs) and the like, for example.

A typical electronic display includes a lower module, a display module, and an upper module. The lower module may contain heat spreaders and cushioning materials. The upper module may contain a touch sensor, an ambient light rejection layer such as a circular polarizer, and often a protective film or cover. These three components are often bonded together using a form of adhesion. When the bonded construction is flexed, strains develop throughout the structure. The strains are not uniform through the thickness and depend in a complex way on the design of the display. If strains exceed a critical threshold in the display module, the display module will mechanically fail, resulting in display defects, general malfunction, or both.

In any bending structure, there is a location through the thickness where there is zero strain known as the neutral bending plane. The location of the neutral plane can, in some cases, be controlled so that strains and stresses are minimized in the display module. If the moduli of the layers above and below the display are similar and the total thickness above and below the display are approximately equal, then by the symmetry of the stack the neutral plane is near the middle (i.e., near the display module). Also, the modulus and thickness of the adhesive placed proximate to the display module and which mechanically couples it to the upper or lower module may be selected to adjust the location of the neutral plane. If the adhesive is substantially more compliant than the adjacent layers, the layers may become partially mechanically decoupled in bending, resulting in multiple neutral planes. Multiple neutral planes may then be positioned in or near vulnerable display components to minimize the stress and strain they experience. In an alternative of the same approach, the compliant layer is chosen such that shear decoupling occurs at the interface between the display module and the layer above it so that the state of stress (compressive or tensile) in the display module is of an opposite sense to that in the upper module (i.e., tensile or compressive). However, the strategy of controlling neutral plane location or introducing multiple neutral planes in order to shield the display module is technically challenging, and slight variations in the material properties or thickness may shift the neutral plane above or below its intended location.

Thus, there is a need for an electronic display which can be folded or bent around a tight radius, for example over a wide range of strain rates or under consideration of other factors.

SUMMARY

A first flexible OLED display device, consistent with the present invention, includes an upper module having a cover window film, a lower module, a display module between the upper and lower modules, and a touch sensor between the display module and the upper module. All modules and the touch sensor can have different Young's moduli and thicknesses. The display module includes an OLED) and an OLED substrate between the OLED and the lower module. In this first device (LS/TW)>0.001, where L is a stiffness of the lower module, S is a stiffness of the OLED substrate, T is a stiffness of the touch sensor, and W is a stiffness of the cover window film.

A second flexible OLED display device, consistent with the present invention, includes an upper module having a cover window film, a lower module, a display module between the upper and lower modules, and a circular polarizer between the display module and the upper module. All modules and the circular polarizer can have different Young's moduli and thicknesses. The display module includes an OLED and an OLED substrate between the OLED and the lower module. In this second device, (LS/(CP)W)>0.004, where L is a stiffness of the lower module, S is a stiffness of the OLED substrate, CP is a stiffness of the circular polarizer, and W is a stiffness of the cover window film.

A third flexible OLED display device, consistent with the present invention, includes an upper module having a cover window film, a lower module, and a display module between the upper and lower modules. All modules can have different Young's moduli, and the display module includes an OLED and an OLED substrate between the OLED and the lower module. In this third device, $(LS/W^2) > 4 \times 10^{-6}$, where L is a stiffness of the lower module, S is a stiffness of the OLED substrate, and W is a stiffness of the cover window film.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

Figure 1:
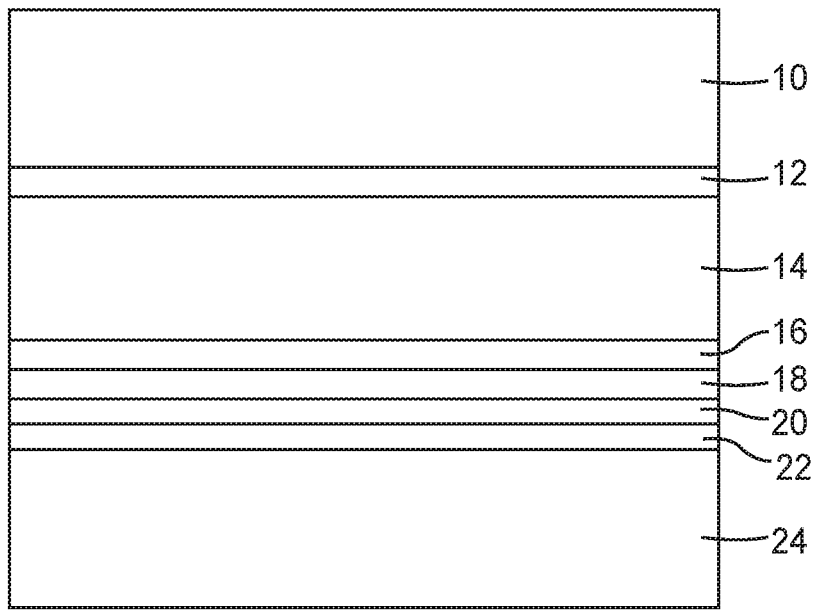
FIG. 1 is a side view of a first embodiment of a foldable OLED display construction.

In one embodiment as shown in FIG. 1, the flexible OLED display construction includes the following elements or layers arranged in the order shown: an upper module having a cover window film 10; a coupling layer 12; a touch sensor panel and/or a circular polarizer 14; a coupling layer 16; an OLED 18; an OLED substrate 20; a coupling layer 22; and a lower module 24. Also in the construction of FIG. 1, the lower module has a first Young's modulus, the OLED substrate has a second Young's modulus, the touch sensor/circular polarizer has a third Young's module, the upper module has a fourth Young's module, and all four moduli can be different from each other. In order to maximize durability in bending for the device of FIG. 1, the mechanical stiffness of the lower module (L) and the stiffness of the OLED substrate (S) divided by the stiffness of the touch sensor/circular polarizer (T) and the stiffness the cover window film (W) is greater than 0.001 or 0.07 or 1.2, as represented by equation (1):

$$Z=(LS/TW)>0.001 \text{ or } 0.07 \text{ or } 1.2 \qquad (1)$$

Figure 6:
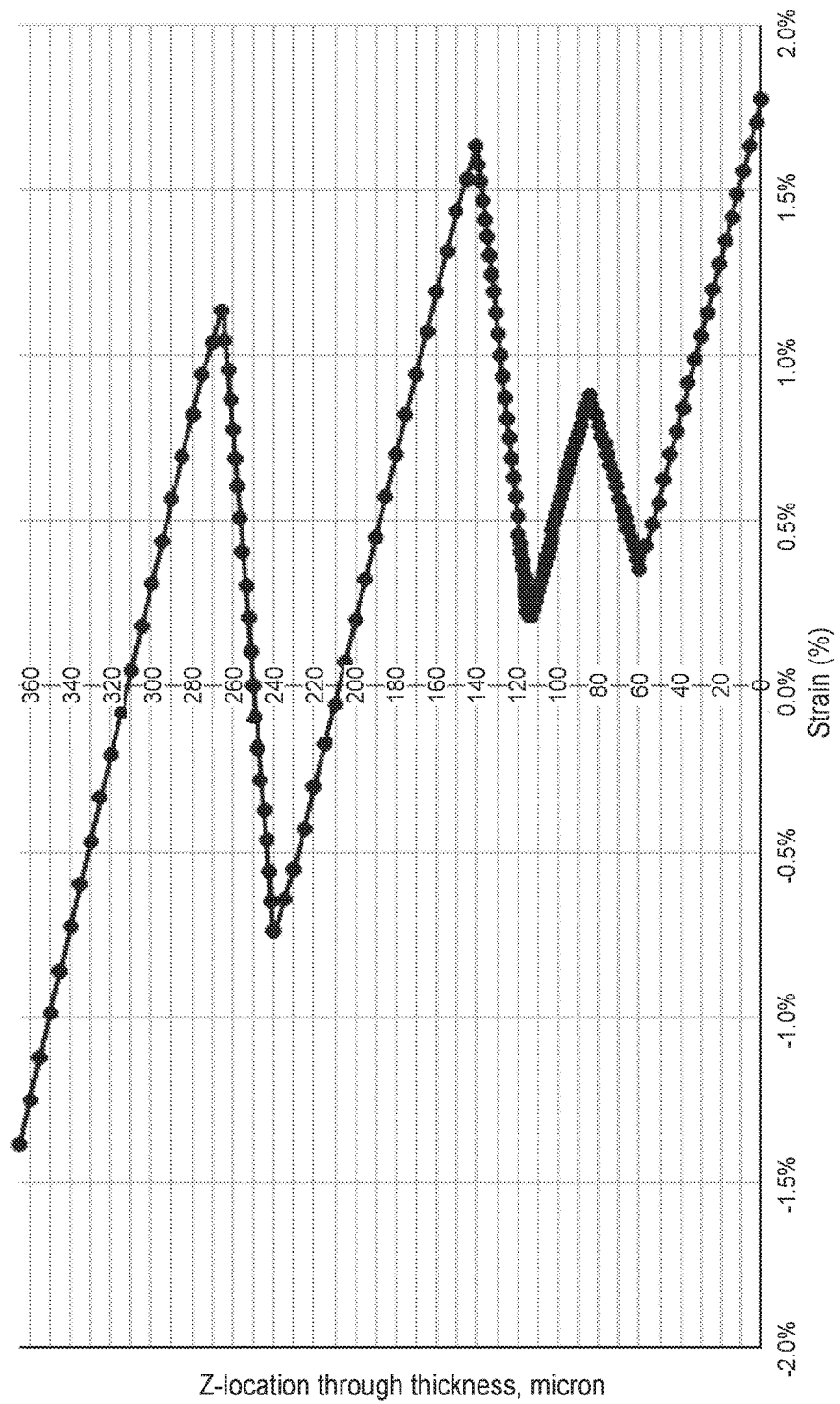
FIG. 6 is a graph of strain versus z-axis position for the foldable OLED display construction of FIG. 1.

A relatively wide range of display designs and coupling layer combinations are acceptable as long as equation (1) is maintained. FIG. 6 shows a plot of strain versus z-axis position for Z equal to a value less than the criteria for the embodiment of FIG. 1. The properties for the plot in FIG. 6 are listed in Table 1. The OLED layer is located between 110 and 115 microns from the bottom.

Finite element analysis has shown that this requirement keeps the OLED plane slightly in compression during in-folding, protecting the sensitive OLED driver layers and thin film encapsulation from strain related damage. A value of Z above 1.2 creates a strain ratio in the display module that is small compared to smaller values of Z and steady with increasing values of Z. The advantage of this observation is that change in the value of Z due to other design modifications should not significantly modify the strain ratio in the display module provided that value remains sufficiently large. Without wishing to be bound by theory it is believed that by placing the flexible display into compression, crack formation and propagation is mitigated. Also, OLED failure is believed to occur primarily due to tensile loads; therefore, the compressive pre-load increases the tensile load which the display may sustain before failure. This approach differs substantially from the approaches that focus on the location of the neutral plane in the display. A further advantage of this invention is that relative stiff coupling layers adhesives may be employed, and yet control of the neutral plane is achieved through modification of the other components. Furthermore, the non-dimensional approach of this invention allows for the simultaneous optimization of the thicknesses, moduli, and Poisson's ratio of several layers to provide the desired bend behavior. Therefore, a layer can be thickened provided that the modulus or thickness of another layer entering into Z is adjusted appropriately.

Figure 2:
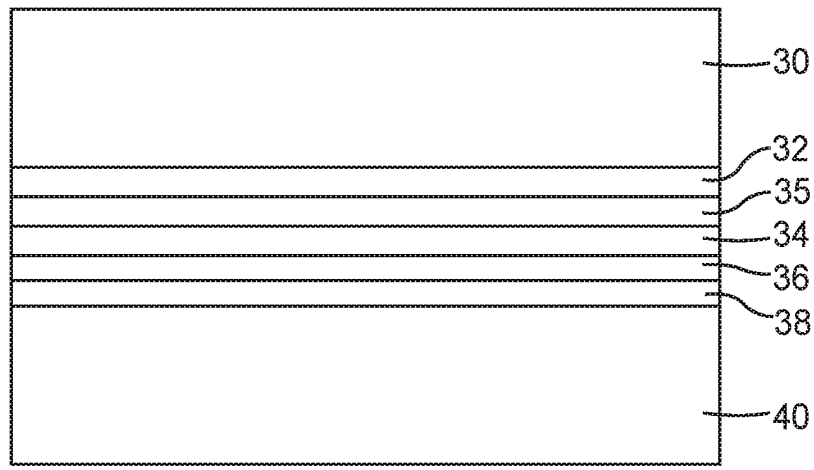
FIG. 2 is a side view of a second embodiment of a foldable OLED display construction.

In another embodiment as shown in FIG. 2, the display construction includes the following elements or layers arranged in the order shown: an upper module having a cover window film 30; a coupling layer 32; a circular polarizer 35; an OLED 34; an OLED substrate 36; a coupling layer 38; and a lower module 40. In the construction shown in FIG. 2, a touch sensor can optionally be part of, or incorporated into, the OLED, and the circular polarizer can be replaced with a color filter layer. Also in the construction of FIG. 2, the lower module has a first Young's modulus, the OLED substrate has a second Young's modulus, the touch sensor/circular polarizer has a third Young's module, the upper module has a fourth Young's module, and all four moduli can be different from each other. In order to maximize durability in bending for the device of FIG. 2, the mechanical stiffness of the lower module (L) and the stiffness of the OLED substrate (S) divided by the stiffness of the circular polarizer (CP) and the stiffness of the cover window film (W) is greater than 0.004 or 0.02 or 0.25, as represented by equation (2).

$$Z'=(LS/(CP)W)>0.004 \text{ or } 0.02 \text{ or } 0.25 \qquad (2)$$

Figure 7:
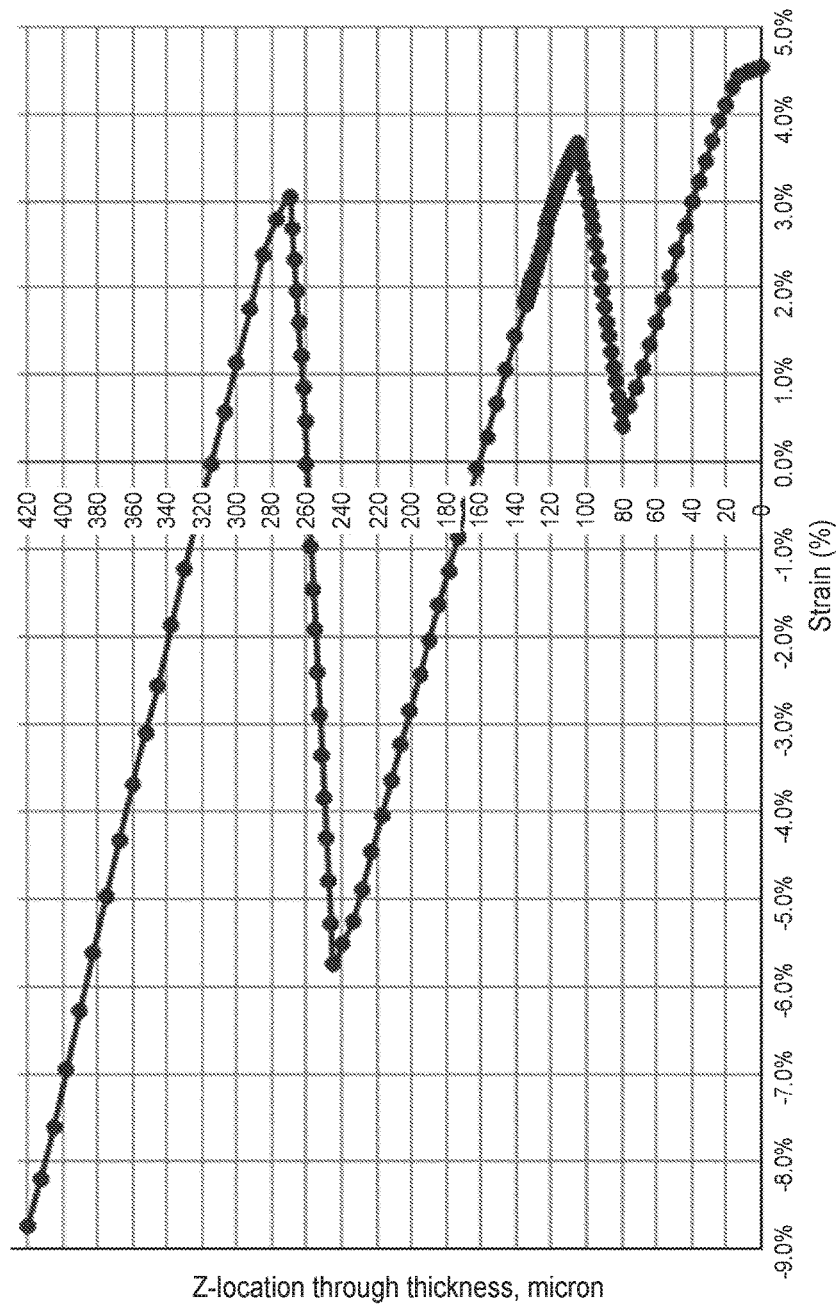
FIG. 7 is a graph of strain versus z-axis position for the foldable OLED display of construction of FIG. 2.

FIG. 7 shows a plot of strain versus z-axis position for Z' equal to a value less than the criteria for the embodiment of FIG. 2. The properties for the plot in FIG. 7 are listed in Table 2. The OLED layer is located between 130 and 135 microns from the bottom.

Figure 3:
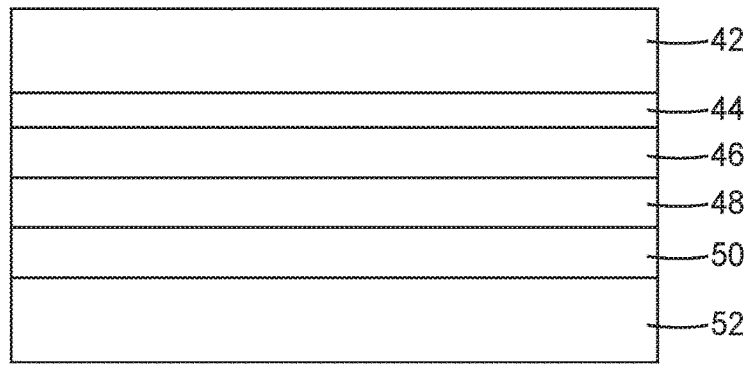
FIG. 3 is a side view of a third embodiment of a foldable OLED display construction.

In another embodiment as shown in FIG. 3, the display construction includes the following elements or layers arranged in the order shown: an upper module having a cover window film 42; a coupling layer 44; an OLED 46; an OLED substrate 48; a coupling layer 50; and a lower module 52. In the construction shown in FIG. 3, a touch sensor can optionally be part of, or incorporated into, the OLED. Also in the construction of FIG. 3, the lower module has a first Young's modulus, the OLED substrate has a second Young's module, and the upper module has a third Young's modulus, and all three moduli can be different from each other. In order to maximize durability in bending for the device of FIG. 3, the mechanical stiffness of the lower module (L) and the stiffness of the OLED substrate (S) divided by the stiffness of the cover window film (W) squared is greater than $4 \times 10^{-6}$, more preferably greater than $4 \times 10^{-5}$, most preferably greater than 0.002, as represented by equation (3).

$$Z''=(LS/W^2)>4\times10^{-6} \text{ or } 4\times10^{-5} \text{ or } 0.002 \qquad (3)$$

Figure 8:
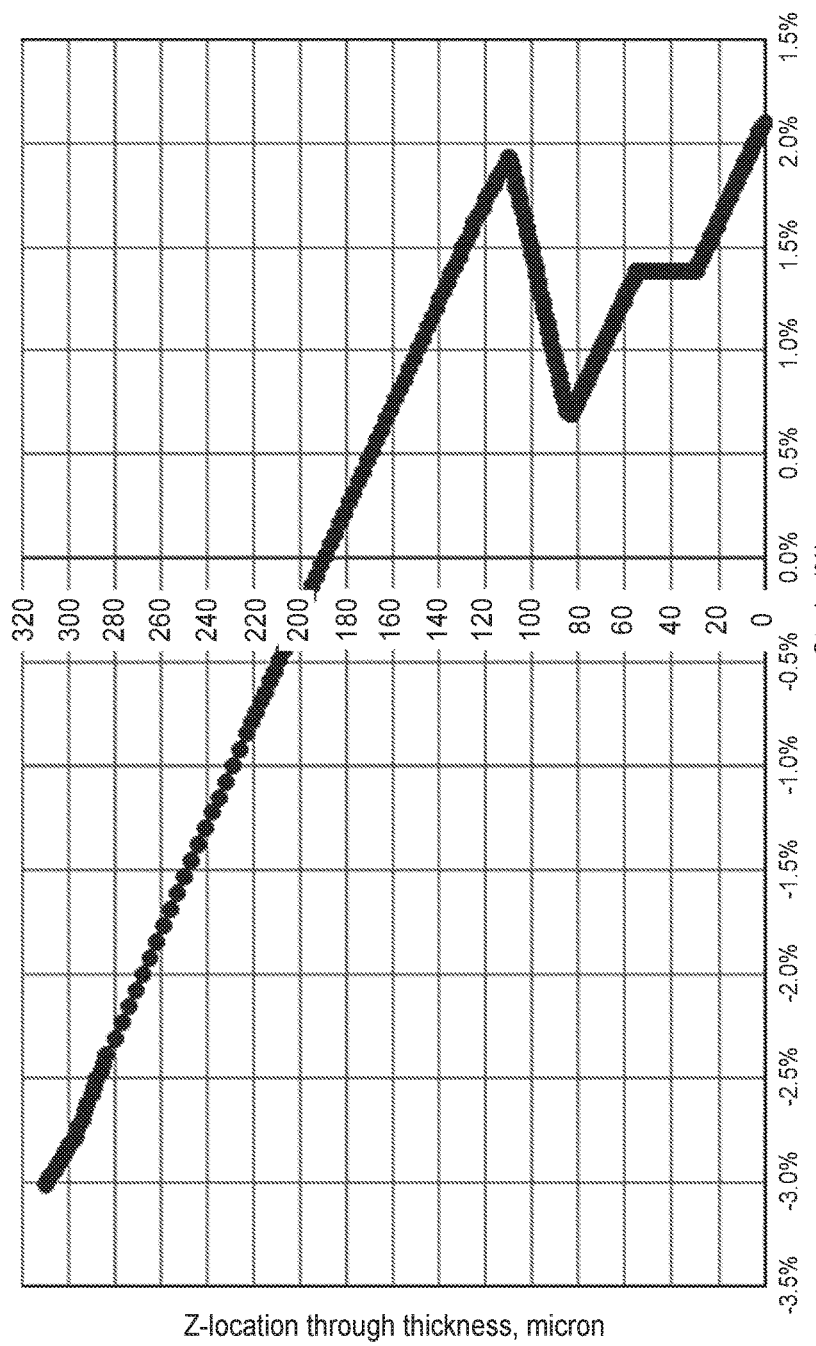
FIG. 8 is a graph of strain versus z-axis position for the foldable OLED display construction of FIG. 3.

FIG. 8 shows a plot of strain versus z-axis position for Z" equal to a value less than the criteria for the embodiment of FIG. 3. The properties for the plot in FIG. 8 are listed in Table 3. The OLED layer is located between 80 and 85 microns from the bottom.

In implementing equations (1)-(3), the thicknesses of the layers are measured in microns and the Young's moduli are measured in megapascals. For a homogeneous material the flexural stiffness (k) may be calculated using equation (4).

$$k = \frac{EI}{1-v^2} \qquad (4)$$

where E is the Young's modulus, I is the second moment of area, and ν is the Poisson's ratio. E and ν are intrinsic material properties, and I is a function of the geometry of the construction. The parameter I is proportional to the width and the cube of the thickness. If all the layers have the same width, a normalized second moment of area $I=t^3/12$, where t is the thickness, can be used and $$k = \frac{Et^3}{12(1-v^2)}$$

The modules or layers described herein may comprise several sublayers of varying thickness and moduli. The effective flexural stiffness of a component comprising several layers may be calculated as follows, where in general to be treated as composite the ratio of the lowest modulus sublayer to the highest modulus sublayer materials must be greater than 1% or greater than 5% or greater than 10%.

Define the flexural stiffness $k_i$ as the stiffness of the $i_{th}$ layer given by $$k_i = \frac{E_i I_i}{1-v_i^2} = E_i' I_i$$

where $I_i$ is the second moment of area of the i-th layer with respect to the centroid (i.e., the location of the neutral axis if the component were to be flexed on its own assuming that it has one neutral plane) and $E_i'$ is plane strain elastic modulus.

The total flexural stiffness of the multilayered component is $$k = \Sigma k_i$$

To calculate $I_i$ let the bottom-most layer be numbered layer 1, and let all layers above be numbered consecutively. Let $t_i$ be the thickness of each layer. Then define $$d_i = \sum_{j=1}^{i-1} t_j + \frac{t_i}{2}$$

so that $d_i$ is the distance from the bottom of layer 1 to the center of layer i. The second moment of area of the $i_{th}$ layer with respect to the bottom of layer 1, is given by $$I_i' = \frac{t_i^3}{12} + t_i d_i^2$$

$I_i$ is given then by $$I_i = I_i' - t_i y_c^2$$

where the centroid location $y_c$ is calculated as $$y_c = \frac{\sum d_i E_i' t_i}{\sum E_i' t_i}$$

Finally, the effective flexural stiffness is given by $$k = \sum \frac{E_i I_i'}{1-v_i^2} - \left(\sum \frac{E_i t_i}{1-v_i^2}\right) y_c^2$$

This procedure can be considered with a three-layer construction of layers 1, 2, and 3, where layer 1 is the bottom-most layer, layer 3 is the top-most layer, and layer 2 is between layer 1 and layer 3. Each layer has a modulus (E), a thickness (t), and a Poisson's ratio (ν). The distance from the base of layer 1 (i.e., the x axis) to the middle of layer 1 is $$d_1 = \frac{t_1}{2}$$

and shifted flexural stiffness of layer 1 is $$I_1' = \frac{t_1^3}{12} + t_1 d_1^2$$

For layer 2, the distance from the base of layer 1 to the middle of layer 2 is $$d_2 = t_1 + \frac{t_2}{2}$$

and the shifted flexural stiffness of layer 2 is $$I_2' = \frac{t_2^3}{12} + t_2 d_2^2$$

Finally, the distance from the base of layer 1 to the middle of layer 3 is $$d_3 = t_1 + t_2 + \frac{t_3}{2}$$

and the shifted flexural stiffness is $$I_3' = \frac{t_3^3}{12} + t_3 d_3^2$$

and $$y_c = \frac{d_1 E_1' t_1 + d_2 E_2' t_2 + d_3 E_3' t_3}{E_1' t_1 + E_2' t_2 + E_3' t_3}$$

Figure 4:
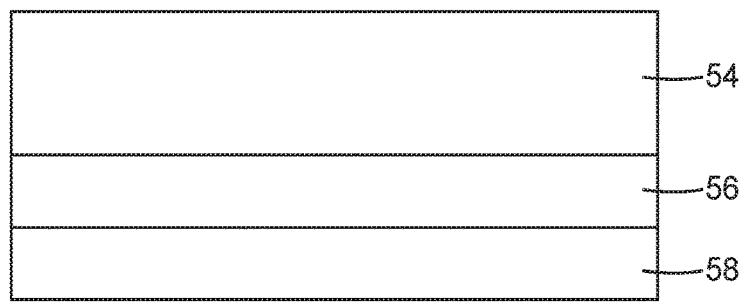
FIG. 4 is a side view of a window film article for use with a foldable OLED display.

FIG. 4 is a side view of a window film article for use with foldable OLED displays such as those described herein. The article shown in FIG. 4 includes the following elements or layers arranged in the order shown: a cover window film 54; a coupling layer 56; and a liner 58. The liner provides protection for the coupling layer 56. In use, liner 58 is removed, and cover window film 54 is applied and adhered to an OLED display via coupling layer 56. For example, coupling layer 56 can be directly applied to touch sensor panel 14 for the embodiment of FIG. 1, circular polarizer 35 for the embodiment of FIG. 2, or OLED 46 for the embodiment of FIG. 3.

Figure 5:
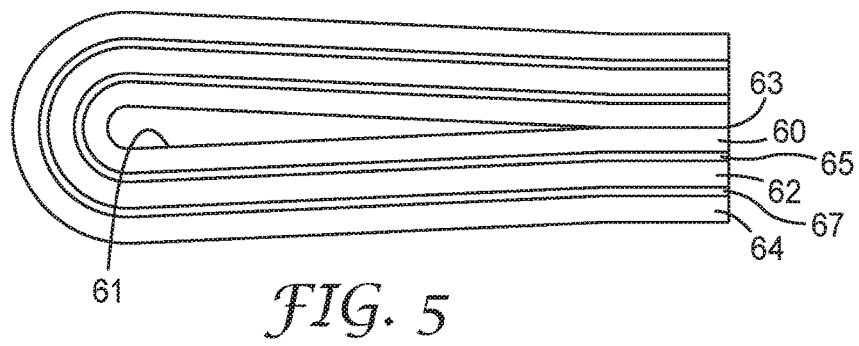
FIG. 5 is a side view of a foldable OLED display in a folded or bent configuration.

FIG. 5 is a side view of a foldable OLED display, such as those display constructions described herein, in a folded or bent configuration. In particular, the OLED display includes, arranged as shown, an upper module 60, a coupling layer 65, a display module 62, a coupling layer 67, and a lower module 64. The OLED display can be folded or bent, as shown, such that a top surface 61 (the viewer side) of upper module 60 faces itself, and the ends 63 of upper module 60 are in physical contact with one another.

The following are definitions and descriptions of terms used herein, including the layers within the display designs.

The "cover window film" is a protective display film construction which maintains optical properties of a display film while possibly providing scratch, abrasion, and impact resistance to the display. The cover window film can be implemented with a thin flexible glass, a polymer film, or a polymer and glass laminate. The term "thin glass" means glass that is 10-100 microns thick and most preferably 25-50 microns thick. The cover window film may comprise multiple sublayers and coatings. The sublayers may be polymers or glass. The minimum effective modulus of the total window film construction is 300 MPa. If the cover window film includes glass, the effective modulus may be as high as 100 GPa. If the cover window film includes glass, the thickness of the glass layers is typically from 10-100 microns, more preferably 25-50 microns. The total thickness of the window film is typically from 20-250 microns depending on materials and construction. If any of the sublayers in the window film comprise an adhesive, the room temperature shear modulus of the adhesive is greater than 3.3% or greater than 1.7% or greater than 1% of the Young's modulus of the film layers that surround it.

The "coupling layer" is a soft adhesive or grease like material with room temperature shear modulus less than 1% of the layers that surround it. In some cases the room temperature shear modulus may be less than 30 MPa, more preferably less than 1 MPa, most preferably less than 70 kPa. If the coupling layer is an optically clear adhesive, then a shear modulus of such coupling layer is greater than 150 kPa at room temperature. The coupling layer does not dewet when the flexible display is bent. Typical thickness ranges for the coupling layer are 25-100 microns. If the coupling layer(s) are in the optical path for the emitted light, the optical transmission in the visible range will typically greater than 90% and the haze less than 2%. Coupling layers in the optical path must maintain optical contact between the stiffer layers (i.e. no air gaps or dewetting). Coupling layers not within the optical path can be, but need not be, clear or transparent. Examples of coupling layers include optically clear adhesives (OCAs). The optical adhesive layer may include acrylate, silicone, polyolefin, polyester, polyurethane or polyisobutylene based optical adhesives. The OCAs may be a pressure sensitive adhesive.

The "upper module" includes the cover window film. The upper module can also optionally include a touch sensor panel layer, ambient light rejecting layers such as a circular polarizer or color filter layer, or separate moisture and oxygen barrier layers.

The "display module" includes the OLED and the substrate for the OLED (typically polyimide but can also be glass), buffer layers, transistor layers, emitters and the thin film encapsulation barrier layers if present. In some cases ambient light rejecting layers such as a circular polarizer or color filter layer may be directly bonded or coated onto the OLED. The typical thickness of the display module is 20-50 microns. The display module can be made by, for example, coating polyimide on glass, depositing the layers of the OLED, and then removing the glass. Circuitry to enable touch sensor capability may also be within the display module. If any of the sublayers in the display modulus comprise an adhesive, the room temperature shear modulus of the adhesive is greater than 3.3% the Young's modulus of the layers that surround it. If any of the sublayers in the cover window film comprise an adhesive, the room temperature shear modulus of the adhesive is greater than 3.3% the Young's modulus of the film layers that surround it.

The "lower module" includes at least one substrate. The lower module can also optionally include thermally conductive layers such as copper or graphite, layers to minimize electromagnetic interference between the display module and the driver circuitry, barrier layers and cushioning materials such as foams to improve impact resistance of the panel.

Curvature—bend radii of interest is ≤10 mm, ≤5 mm, ≤3 mm, ≤2 mm, or ≤1 mm. The curvature equals one-half the maximum distance between the lower module outer surface for in-folding device when the device is closed. The curvature equals one-half the maximum distance between the window film surfaces for an out-folding device when the device is closed. For an out-folding device, the parameter equations for Z, Z', and Z" are inverted, such that the inverse of equations (1), (2), and (3) apply to out-folding devices having the constructions corresponding with those equations. For a static (non-folding display) the curvature equals the smallest radius of curvature for either the outer surface of the low module or the window.

The designs described here are based on finite element modeling for the schematic construction shown in FIG. 1, 2, 3. Bifold bending of this construction such that the cover window film faced itself was modeled around a 1 mm, 2 mm, 3 mm, and 5 mm curvature. The thicknesses and moduli of the OLED substrate, the lower module, the cover window film, and the touch panel were all allowed to vary. The maximum tensile strain and maximum compressive strain throughout the entire OLED layer were noted. Based on the experiments, relationships between the cover window film, lower module, and OLED substrate were derived such that strains remain at an acceptable level in the OLED layer. Representative results are listed in Tables 1-3 along with the design parameters. Table 1 results are based on finite element modeling for the schematic construction shown in FIG. 1; Table 2 of the designs shown in FIG. 2, and Table 3 of the designs in FIG. 3.

A commercial finite element analysis software, ANSYS Mechanical APDL 14.0 (Ansys Inc., Pittsburgh Pa., USA) and DOE analysis software, Isight 5.8 (Dassault Systèmes Simulia Corp., Providence, R.I., USA), were used to create mathematical models of folding display device and calculate principal tensile and compressive strains in the OLED layer for various design parameters. Bending was enabled by two rigid hinges rotating up to 90° and distanced by twice the curvature with the outer surfaces allowed to slide on both hinges. A typical foldable device width of 100 mm and length of 180 mm allowed to use symmetry considerations and plane strain elements to reduce the model to a two-dimensional cross-section of fixed length of 90 mm long and of variable thicknesses.

The simplified model of the display represented by layers of isotropic uniform materials coupled by adhesives proves sufficient to capture major aspects of bending mechanics without a need to include non-essential from mechanical view point details. OLED components of the display module were modeled as a 5 micron thick film with elastic modulus of 80 GPa which was bonded to the display substrate. The coupling layers were modeled as incompressible hyperelastic material characterized by instantaneous shear modulus G. The other components were modeled as uniform isotropic thermoplastics characterized by the Young elastic modulus E, Poisson ratio and yield stress.

TABLE 1

| | Curvature μm | E1 MPa | Lower Module Thickness μm | CL1Mod MPa | CL1Thick μm | E2 MPa | OLED Substrate Thickness μm | CL3_mod MPa | CL3Thick μm | E3 MPa | Touch Panel Thickness μm | CL4_mod MPa |
|---|---|---|---|---|---|---|---|---|---|---|---|---|
| Ex. 1 | 3000 | 5000 | 120 | 0.1 | 25 | 5000 | 50 | 0.07 | 25 | 1900 | 100 | 0.5 |
| Ex. 2 | 3000 | 2700 | 60 | 1 | 25 | 3200 | 25 | 1 | 50 | 3200 | 25 | 0.1 |
| Ex. 3 | 3000 | 2700 | 60 | 1 | 50 | 3200 | 25 | 0.1 | 25 | 3200 | 25 | 1 |
| Ex. 4 | −5000 | 2700 | 60 | 0.1 | 25 | 7000 | 50 | 0.1 | 25 | 1900 | 100 | 0.1 |
| Ex. 5 | 5000 | 5000 | 60 | 0.1 | 25 | 5000 | 25 | 0.07 | 25 | 1900 | 100 | 0.07 |

| | CL4Thick μm | E4 MPa | Upper Module Thickness μm | L MPa*μm³ | S MPa*μm³ | T MPa*μm³ | W MPa*μm³ | LS/TW | OLED Compres % | OLED Tensile % | |
|---|---|---|---|---|---|---|---|---|---|---|---|
| Ex. 1 | 25 | 72300 | 100 | 8.42E+08 | 6.09E+07 | 1.85E+08 | 8.36E+09 | 4.35E−02 | −0.0093 | 0.117 | FIG. 1 |
| Ex. 2 | 25 | 4850 | 50 | 5.68E+07 | 4.87E+06 | 4.87E+06 | 5.90E+07 | 9.62E−01 | −0.033 | 0.1826 | FIG. 1 |
| Ex. 3 | 25 | 4850 | 50 | 5.68E+07 | 4.87E+06 | 4.87E+06 | 5.90E+07 | 9.62E−01 | −0.3979 | −0.1803 | FIG. 1 |
| Ex. 4 | 25 | 4700 | 100 | 5.68E+07 | 8.52E+07 | 1.85E+08 | 4.58E+08 | 1.75E+01 | −0.1364 | −0.0029 | FIG. 1 |
| Ex. 5 | 25 | 72300 | 100 | 1.05E+08 | 7.61E+06 | 1.85E+08 | 6.36E+09 | 6.80E−04 | 0.169 | 0.2918 | FIG. 6 |

TABLE 2

| | Curvature μm | E1 MPa | Lower Module Thickness μm | CL1Mod MPa | CL1Thick μm | E2 MPa | OLED Substrate Thickness μm | E3 MPa | Touch Panel Thickness μm | CL4_mod MPa | CL4Thick μm |
|---|---|---|---|---|---|---|---|---|---|---|---|
| Ex. 6 | 5000 | 3375 | 120 | 0.1 | 25 | 5000 | 50 | 1900 | 50 | 0.07 | 25 |
| Ex. 7 | 3000 | 2700 | 120 | 0.1 | 25 | 5000 | 25 | 1900 | 50 | 0.05 | 50 |
| Ex. 8 | 2000 | 2700 | 80 | 0.1 | 25 | 5000 | 25 | 1900 | 110 | 0.05 | 50 |

| | E4 MPa | Upper Module Thickness μm | L MPa*μm³ | S MPa*μm³ | P MPa*μm³ | W MPa*μm³ | LS/(CP)W | OLED Compres % | OLED Tensile % | |
|---|---|---|---|---|---|---|---|---|---|---|
| Ex. 6 | 72000 | 50 | 5.68E+08 | 6.09E+07 | 2.31E+07 | 7.92E+08 | 1.89E+00 | −0.0714 | 0.0572 | FIG. 2 |
| Ex. 7 | 900 | 150 | 4.54E+08 | 7.61E+06 | 2.31E+07 | 3.07E+08 | 4.86E−01 | −0.3151 | 0.0805 | FIG. 2 |
| Ex. 8 | 5000 | 150 | 1.35E+08 | 7.61E+06 | 2.46E+08 | 1.64E+09 | 2.53E−03 | 1.8118 | 2.1563 | FIG. 7 |

TABLE 3

| | Curvature μm | E1 MPa | Lower Module Thickness μm | CL1Mod MPa | CL1Thick μm | E2 MPa | OLED Substrate Thickness μm | CL4_mod MPa | CL4Thick μm |
|---|---|---|---|---|---|---|---|---|---|
| Ex. 9 | 1000 | 2700 | 60 | 0.1 | 25 | 5000 | 25 | 0.1 | 25 |
| Ex. 10 | 5000 | 2700 | 30 | 0.1 | 25 | 5000 | 25 | 0.07 | 25 |

| | E3 MPa | Upper Module Thickness μm | L MPa*μm³ | S MPa*μm³ | W MPa*μm³ | LS/W² | OLED min Strain % | OLED max Strain % | |
|---|---|---|---|---|---|---|---|---|---|
| Ex. 9 | 5000 | 100 | 5.68E+07 | 7.61E+06 | 4.87E+08 | 1.82E−03 | −0.8039 | 0.2006 | FIG. 3 |
| Ex. 10 | 5000 | 200 | 7.10E+06 | 7.61E+06 | 3.90E+09 | 3.56E−06 | 0.6563 | 0.7783 | FIG. 8 |

Another embodiment includes the construction shown in FIGS. 1, 2, and 3 where a module with a light emissive material is used instead of the display module. In particular, the module includes a light emissive material, such as an OLED or other light emissive material, and a substrate to support the light emissive material, along with an upper module and a lower module having different Young's moduli as described herein and with respect to FIG. 3. This embodiment can be used for solid state lighting or decorative lighting purposes, for example.

The following further recite other embodiments of the invention.

Item 1 is a flexible light emissive device, comprising:
an upper module having a cover window film;
a lower module; and
a module between the upper module and the lower module, the module including a light emissive material and a substrate between the light emissive material and the lower module,
wherein the lower module has a first Young's modulus, the upper module has a second Young's module, and the first Young's modulus is different from the second Young's modulus,
wherein $(LS/W^2) > 4 \times 10^{-6}$, where L is a stiffness of the lower module, S is a stiffness of the substrate, and W is a stiffness of the cover window film.

Item 2 is the device of Item 1, wherein $(LS/W^2) > 4 \times 10^3$.

Item 3 is the device of Item 1, wherein $(LS/W^2) > 0.002$.

Item 4 is the device of any preceding Item 1 to Item 3, further comprising a first coupling layer between the cover window film and the light emissive material and a second coupling layer between the substrate and the lower module.

Item 5 is the device of Item 4, wherein the first coupling layer comprises an optically clear adhesive.

Item 6 is a window film for use with a flexible OLED display device, comprising:
a cover window film; and
a coupling layer on a major surface of the cover window film,
wherein when the cover window film is mechanically coupled to the OLED display device having, in the following order, the cover window film, the coupling layer, a display module including an OLED and an OLED substrate on a side of the OLED opposite the cover window film, and a lower module, then $(LS/W^2) > 0.001$ or 0.07 or 1.2, where L is a stiffness of the lower module, S is a stiffness of the OLED substrate, and W is a stiffness of the window film.

Item 7 is the window film of Item 6, further including a liner on a side of the coupling layer opposite the cover window film.

Item 8 is the window film of Item 6 or Item 7, wherein the coupling layer comprises an optically clear adhesive.

The invention claimed is:

1. A flexible organic light emitting diode (OLED) display device, comprising:
an upper module having a cover window film;
a lower module;
a display module between the upper module and the lower module, the display module including an OLED and an OLED substrate between the OLED and the lower module; and
a touch sensor between the OLED and the upper module,
wherein the upper module has a first Young's modulus, the lower module has a second Young's modulus, and the first Young's modulus is different from the second Young's modulus,
wherein $100 > (LS/TW) > 0.001$, where L is a flexural stiffness of the lower module, S is a flexural stiffness of the OLED substrate, T is a flexural stiffness of the touch sensor, and W is a flexural stiffness of the cover window film.

2. The display device of claim 1, wherein $100 > (LS/TW) > 0.07$.

3. The display device of claim 1, wherein $100 > (LS/TW) > 1.2$.

4. The display device of claim 1, further comprising a first coupling layer between the cover window film and the touch sensor, a second coupling layer between the touch sensor and the OLED, and a third coupling layer between the OLED substrate and the lower module.

5. The display device of claim 4, wherein a shear modulus of the first coupling layer is greater than 150 kPa at room temperature.

6. The display device of claim 4, wherein the first and second coupling layers each comprise an optically clear adhesive.

7. The display device of claim 1, wherein the cover window film comprises a thin glass.

8. The display device of claim 1, wherein $17.5 > (LS/TW) > 0.001$.

9. A flexible organic light emitting diode (OLED) display device, comprising:
an upper module having a cover window film;
a lower module;
a display module between the upper module and the lower module, the display module including an OLED and an OLED substrate between the OLED and the lower module; and
a circular polarizer between the OLED and the upper module,
wherein the upper module has a first Young's modulus, the lower module has a second Young's modulus, and the first Young's modulus is different from the second Young's modulus,
wherein $100 > (LS/(CP)W) > 0.004$, where L is a flexural stiffness of the lower module, S is a flexural stiffness of the OLED substrate, CP is a flexural stiffness of the circular polarizer, and W is a flexural stiffness of the cover window film.

10. The display device of claim 9, wherein $100 > (LS/(CP)W) > 0.02$.

11. The display device of claim 9, wherein $100 > (LS/(CP)W) > 0.25$.

12. The display device of claim 9, wherein the circular polarizer includes a touch sensor.

13. The display device of claim 9, further comprising a first coupling layer between the cover window film and the circular polarizer and a second coupling layer between the OLED substrate and the lower module.

14. The display device of claim 13, wherein a shear modulus of the first coupling layer is greater than 150 kPa at room temperature.

15. The display device of claim 13, wherein the first coupling layer comprises an optically clear adhesive.

16. The display device of claim 9, wherein the cover window film comprises a thin glass.

17. The device of claim 9, wherein $1.89 > (LS/(CP)W) > 0.004$.

18. A flexible organic light emitting diode (OLED) display device, comprising:
an upper module having, a cover window film;
a lower module; and a display module between the upper module and the lower module, the display module including an OLED and an OLED substrate between the OLED and the lower module, wherein the upper module has a first Young's modulus, the lower module has a second Young's modulus, and the first Young's modulus is different from the second Young's modulus, wherein $100>(LS/W^2)>4\times10^{-6}$, where L is a flexural stiffness of the lower module, S is a flexural stiffness of the OLED substrate, and W is a flexural stiffness of the cover window film.

19. The display device of claim 18, wherein $100>(LS/W^2)>4\times10^{-5}$.

20. The display device of claim 18, wherein $100>(LS/W^2)>0.002$.

21. The display device of claim 18, wherein the OLED includes a touch sensor.

22. The display device of claim 18, further comprising a first coupling layer between the cover window film and the OLED and a second coupling layer between the OLED substrate and the lower module.

23. The display device of claim 22, wherein a shear modulus of the first coupling layer is greater than 150 kPa at room temperature.

24. The display device of claim 22, wherein the first coupling layer comprises an optically clear adhesive.

25. The display device of claim 18, wherein the cover window film comprises a thin glass.

26. The display device of claim 18, wherein $1.82\times10^{-3}>(LS/W^2)>4\times10^{-6}$.

* * * * *

UNITED STATES PATENT AND TRADEMARK OFFICE
CERTIFICATE OF CORRECTION

PATENT NO. : 10,147,772 B2
APPLICATION NO. : 15/244146
DATED : December 4, 2018
INVENTOR(S) : Evan Breedlove Page 1 of 1

It is certified that error appears in the above-identified patent and that said Letters Patent is hereby corrected as shown below:

In the Specification

Column 1
Line 66, delete "OLED)" and insert -- OLED --.

Columns 9/10
Table 1, approx. Line 5, row "Ex. 1", column "Curvature μm", delete "3000" and insert -- 5000 --.
Table 1, approx. Line 13, row "Ex. 1", column "W", delete "8.36E+09" and insert -- 6.36E+09 --.
Table 2, approx. Line 13, row "Ex. 7", column "OLED Tensile %", delete "0.0805" and insert -- -0.0805 --.
Table 2, approx. Line 14, row "Ex. 8", column "OLED Tensile %", delete "2.1563" and insert -- 2.1561 --.

Column 11
Line 27, delete "$10^3$." and insert -- $10^{-5}$. --.

In the Claims

Column 12
Line 62, Claim 17, delete "device" and insert -- display device --.
Line 66, Claim 18, delete "having," and insert -- having --.

Signed and Sealed this
Eighteenth Day of June, 2019

Andrei Iancu
*Director of the United States Patent and Trademark Office*